(12) United States Patent
Zhou et al.

(10) Patent No.: US 12,098,299 B2
(45) Date of Patent: Sep. 24, 2024

(54) CHEMICAL MECHANICAL POLISHING SLURRY AND USE THEREOF

(71) Applicant: ANJI MICROELECTRONICS (SHANGHAI) CO., LTD, Shanghai (CN)

(72) Inventors: Wenting Zhou, Shanghai (CN); Jianfen Jing, Shanghai (CN); Ying Yao, Shanghai (CN); Xinyuan Cai, Shanghai (CN); Jian Ma, Shanghai (CN); Heng Li, Shanghai (CN)

(73) Assignee: ANJI MICROELECTRONICS (SHANGHAI) CO., LTD., Shanghai (CN)

( * ) Notice: Subject to any disclaimer, the term of this patent is extended or adjusted under 35 U.S.C. 154(b) by 704 days.

(21) Appl. No.: 17/418,745

(22) PCT Filed: Dec. 18, 2019

(86) PCT No.: PCT/CN2019/126141
§ 371 (c)(1),
(2) Date: Jun. 25, 2021

(87) PCT Pub. No.: WO2020/135168
PCT Pub. Date: Jul. 2, 2020

(65) Prior Publication Data
US 2022/0056308 A1    Feb. 24, 2022

(30) Foreign Application Priority Data

Dec. 29, 2018  (CN) .......................... 201811635542.0

(51) Int. Cl.
*C09G 1/02*    (2006.01)
*H01L 21/321*    (2006.01)

(52) U.S. Cl.
CPC ............ *C09G 1/02* (2013.01); *H01L 21/3212* (2013.01)

(58) Field of Classification Search
CPC .............................. C09G 1/02; H01L 21/3212
See application file for complete search history.

(56) References Cited

U.S. PATENT DOCUMENTS

| 7,201,784 | B2 * | 4/2007 | Miller ................. H01L 21/7684 |
| | | | 106/3 |
| 8,546,261 | B2 * | 10/2013 | Kim ......................... C09G 1/02 |
| | | | 438/692 |
| 2013/0264515 | A1 * | 10/2013 | Chen ...................... C09G 1/02 |
| | | | 568/607 |

FOREIGN PATENT DOCUMENTS

| CN | 101469252 A | 7/2009 |
| CN | 101747843 A | 6/2010 |
| CN | 107523219 B | 12/2017 |
| TW | 201829717 A | 8/2018 |

* cited by examiner

Primary Examiner — Alexandra M Moore
(74) Attorney, Agent, or Firm — Dentons US LLP

(57) ABSTRACT

A chemical mechanical polishing slurry, including silicon dioxide particles, a nitrogen-containing heterocyclic compound having one or more carboxy group(s), and an ethoxylated butoxylated alky alcohol, and use of the chemical mechanical polishing slurry in the polishing silicon oxide, polysilicon, and silicon nitride. Polishing rate for silicon nitride using the polishing slurry is much higher than that for silicon oxide and polysilicon. The polishing slurry can be applied to chemical mechanical polishing in which silicon oxide/polysilicon is used as the stop layer, and can be used to control the amount of oxide and polysilicon removed from the substrate surface during polishing.

10 Claims, No Drawings

CHEMICAL MECHANICAL POLISHING SLURRY AND USE THEREOF

CROSS-REFERENCE TO RELATED APPLICATIONS

This application is a 35 USC § 371 National Stage entry of International Application No. PCT/CN2019/126141, filed on Dec. 18, 2019, which claims the benefit of priority of Chinese Patent Application No. 201811635542.0, filed on Dec. 29, 2018, all of which are incorporated by reference in their entirety herein.

FIELD OF THE INVENTION

The present invention relates to chemical mechanical polishing field, in particular, to a chemical mechanical polishing slurry and its use thereof.

BACKGROUND TO THE INVENTION

During semiconductor chips MFG process, the removal of Silicon Nitride layer is required at every step, for example, in the step of forming an element separation structure, the Silicon Nitride as a kind of barrier layer is required to be removed. However, the removal of such Silicon Nitride layer usually be conducted by a wet etching treatment using such as the mixture of phosphoric/nitric acid, at a high temperature of about 150° C., rarely by a chemical mechanical polishing.

At present, the method for isolating each component in semiconductor devices is mainly the shallow trench isolation (STI) process, that is, Silicon Nitride layer is firstly deposited on the Silicon substrate, then the shallow trench is formed by etching or photolithography of the Silicon Nitride layer, and then shallow trench is filled with the deposited Dielectric layer. Because the depth of the formed trench or the line is usually variety during the etching process, an excess dielectric material is required to deposit on the top of substrate to ensure a complete fill of these trenches. And then the excess Dielectric material (such as oxide) is removed through chemical mechanical polishing process to expose out of the Silicon Nitride layer. Finally, the Silicon Nitride is removed through the chemical mechanical polishing process to obtain a highly flat and uniform surface.

Usually, for the polishing mechanism slurry, it is emphasized all the time that the Oxide polishing should be prior to the Silicon Nitride polishing. The integral polishing rate of the substrate decreases after the Silicon Nitride layer being exposed. Thus, the Silicon Nitride layer is usually used as a stop layer during the chemical mechanical polishing process. With the advance of etching technology, the width of the Oxide line becomes much smaller. Thus, the chemical mechanical polishing slurry used in the polishing process should have a higher polishing ability for Silicon Nitride than that for oxide, so as to reduce the amount of removed oxide from the surface of the substrate as much as possible.

In addition, for some semiconductor devices, the Silicon Nitride layer is required to be removed, and the Silicon oxide and Polysilicon layers are used as stop layers during the chemical mechanical polishing process. Therefore, the chemical mechanical polishing slurry is desired to have specific polishing rate selectivity for Silicon Nitride/Silicon oxide/Polysilicon, that is, a relatively high Silicon Nitride polishing rate, relatively low Silica and Polysilicon polishing rates. However, the existing chemical mechanical polishing slurry does not have such polishing rate selectivity for the above mentioned Silicon Nitride/Silicon oxide/Polysilicon.

SUMMARY OF THE INVENTION

In order to solve the above problems, the present invention provides a chemical mechanical polishing slurry, which uses a complex formulation of a nitrogen-containing heterocyclic compound comprising one or more carboxyl groups and an ethoxylated butoxylated alkyl alcohol to obtain a relatively high Silicon Nitride polishing rate, relatively low Silicon oxide and Polysilicon polishing rates, so as to have the proper polishing rate selectivity for Silicon Nitride/Silicon oxide/Polysilicon.

Specifically, in one aspect of the present invention, provides a chemical mechanical polishing slurry comprising silicon dioxide particles, a nitrogen-containing heterocyclic compound having one or more carboxy group(s), and an ethoxylated butoxylated alky alcohol.

In a preferred embodiment, the mass percentage content of the silicon dioxide particles is 0.5-8 wt %.

In another preferred embodiment, the mass percentage content of the silicon dioxide particles is 1-5 wt %.

In a preferred embodiment, the nitrogen-containing heterocyclic compound having one or more carboxy group(s) is one or more compound(s) selected from the group consisted of pyridine compound having one or more carboxy group(s), piperidine compound having one or more carboxy group(s), pyrrolidine compound having one or more carboxy group(s) and pyrrole compound having one or more carboxy group(s).

In another preferred embodiment, the nitrogen-containing heterocyclic compound having one or more carboxyl group(s) is one or more compound(s) selected from the group consist of 2-carboxyl pyridine, 3-carboxyl pyridine, 4-carboxyl pyridine, 2,3-dicarboxyl pyridine, 2,4-dicarboxyl pyridine, 3,4-dicarboxyl pyridine, 2,6-dicarboxyl pyridine, 3,5-dicarboxyl pyridine, 2-carboxyl piperidine, 3-carboxyl piperidine, 4-carboxyl piperidine, 2,3-dicarboxyl piperidine, 2,4-dicarboxyl piperidine, 2,6-dicarboxyl piperidine, 3,5-dicarboxyl piperidine, 2-carboxyl pyrrolidine, 3-carboxyl pyrrolidine, 2,4-dicarboxyl pyrrolidine, 2,5-dicarboxyl pyrrolidine, 2-carboxyl pyrrole, 3-carboxyl pyrrole and 2,5-dicarboxypyrrole.

In a preferred embodiment, the mass percentage content of nitrogen-containing heterocyclic compound having one or more carboxyl group(s) is 0.01-0.5 wt %.

In a preferred embodiment, in the ethoxylated butoxylated alkyl alcohol, the number of ethoxy groups x is 5-20, the number of butoxy groups y is 5-20, and the alkyl group is a straight or branched chain with 11-15 carbon atoms.

In a preferred embodiment, the mass percentage content of the ethoxylated butoxylated alky alcohol is 0.01-01 wt %.

In a preferred embodiment, the pH value of the chemical mechanical polishing slurry is 2-6.

In some preferred embodiments, the chemical mechanical polishing slurry of the invention further comprises a pH adjustor and a bactericide, wherein the bactericide maybe one or more compound(s) selected from the group consisted of 5-chloro-2-methyl-4-isothiazolin-3-ketone, 2-methyl-4-isothiazolinone, 1,2-phenylpropanzothiazolinone, iodopropynyl carbamate, and 1,3-dihydroxymethyl-5,5-methylheine (DMDMH), etc. The pH adjustor maybe one or more compound selected from the group consist of $HNO_3$, KOH, $K_2HPO_4$, and $KH_2PO_4$, etc.

On another aspect of the invention, further provides a use of the chemical mechanical polishing slurry in the polishing of Silicon Oxide, Polysilicon and Silicon Nitride is provided.

Compared with the prior art, the present invention has the following advantages: in the polishing slurry comprising silicon dioxide particles, a complex formulation of the nitrogen-containing heterocyclic compound comprising one or more carboxyl groups and the ethoxylated butoxylated alkyl alcohol is used, so that the polishing slurry has a much higher polishing rate to the Silicon Nitride polishing rate than to the Silicon Oxide and Polysilicon, thus, it can be well used in chemical mechanical polishing wherein the Silicon Oxide/Polysilicon is used as the stop layer, and can better control the amount of the removed Oxide and polysilicon from the substrate surface during the polishing process.

DETAILED DESCRIPTION OF PREFERRED EMBODIMENTS

A description of embodiments is given to illustrate the advantage of the present invention in detail below, but the protection scope of the present invention is not limited to these embodiments.

The components and content of embodiments 1-10 and the comparative embodiments 1-5 are given in table 1. All components are mixed well, adjusted pH value to corresponding value with pH adjustor and complemented the mass percentage to 100% with water, to prepare the embodiments 1-10 and the comparative embodiments 1-5.

TABLE 1

Components and Contents of Embodiments 1-10 and Comparative Embodiments 1-5

| | Abrasive Particles | | Carboxyl Pyridine Compound/Organic Acid | | $(Ethoxylated)_x(Butoxylated)_y$ Alkyl Alcohol | | |
|---|---|---|---|---|---|---|---|
| | Component | Content (wt %) | Component | Content (wt %) | Component | Content (wt %) | pH |
| Comparative Embodiment 1 | $SiO_2$ | 3 | — | — | — | — | 2 |
| Comparative Embodiment 2 | $SiO_2$ | 3 | Hydroxyethylene-1,1-diphosphoric acid | 0.05 | — | — | 2 |
| Comparative Embodiment 3 | $SiO_2$ | 3 | Ascorbic acid | 0.05 | — | — | 2 |
| Comparative Embodiment 4 | $SiO_2$ | 3 | 2-carboxyl pyridine | 0.05 | — | — | 2 |
| Comparative Embodiment 5 | $SiO_2$ | 3 | — | — | $(Ethoxylated)_5(Butoxylated)_{10}C12$-alcohol | 0.01 | 2 |
| Embodiment 1 | $SiO_2$ | 3 | 2-carboxyl pyridine | 0.2 | $(Ethoxylated)_8(Butoxylated)_5C11$-alcohol | 0.01 | 2 |
| Embodiment 2 | $SiO_2$ | 0.5 | 2,6-dicarboxyl pyridine | 0.01 | $(Ethoxylated)_{12}(Butoxylated)_8C12$-alcohol | 0.05 | 3 |
| Embodiment 3 | $SiO_2$ | 1 | 3-carboxyl piperidine | 0.06 | $(Ethoxylated)_{20}(Butoxylated)_{12}C13$-alcohol | 0.1 | 4.5 |
| Embodiment 4 | $SiO_2$ | 5 | 2,4-dicarboxyl piperidine | 0.04 | $(Ethoxylated)_{16}(Butoxylated)_{20}C14$-alcohol | 0.2 | 5.6 |
| Embodiment 5 | $SiO_2$ | 6 | 2-carboxyl pyrrolidine | 0.3 | $(Ethoxylated)_8(Butoxylated)_5C15$-alcohol | 0.5 | 6 |
| Embodiment 6 | $SiO_2$ | 8 | 2,5-dicarboxyl pyrrolidine | 0.03 | $(Ethoxylated)_{10}(Butoxylated)_{14}C12$-alcohol | 0.1 | 4.8 |
| Embodiment 7 | $SiO_2$ | 2 | 2-carboxyl pyrrole | 0.1 | $(Ethoxylated)_{13}(Butoxylated)_8C14$-alcohol | 0.03 | 5 |
| Embodiment 8 | $SiO_2$ | 2 | 2,5-dicarboxypyrrole | 0.05 | $(Ethoxylated)_{10}(Butoxylated)_7C12$-alcohol | 1 | 5.3 |
| Embodiment 9 | $SiO_2$ | 2 | 2-carboxyl pyridine | 0.5 | $(Ethoxylated)_9(Butoxylated)_7C13$-alcohol | 0.6 | 4.3 |
| Embodiment 10 | $SiO_2$ | 2 | 2-carboxyl pyridine | 0.05 | $(Ethoxylated)_{16}(Butoxylated)_6C13$-alcohol | 0.3 | 5.8 |

8 inch Polysilicon wafers comprising Silicon Nitride and Silicon Oxide are polished using the polishing slurry of embodiments 1-10 and comparative embodiments 1-5 respectively. The specific polishing conditions comprising: LKpolisher, IC1010 polishing pad, 93/87 rpm of platen/head rotation speed, 1.5 psi of polishing pressure and 150 ml/min of solution flow rate. The polishing rate of the polishing slurry to copper and Silicon Nitride is recorded in table 2.

TABLE 2

Polishing results of embodiments 1-10 and comparative embodiments 1-5

| | Polishing Rate for Silicon Nitride (Å/min) | Polishing Rate for Silicon Oxide (Å/min) | Polishing Rate for Polysilicon (Å/min) |
|---|---|---|---|
| Comparative Embodiment 1 | 23 | 623 | 547 |
| Comparative Embodiment 2 | 405 | 426 | 641 |
| Comparative Embodiment 3 | 325 | 401 | 594 |
| Comparative Embodiment 4 | 656 | 611 | 543 |
| Comparative Embodiment 5 | 23 | 321 | 258 |
| Embodiment 1 | 648 | 45 | 58 |
| Embodiment 2 | 445 | 10 | 24 |
| Embodiment 3 | 514 | 8 | 17 |
| Embodiment 4 | 784 | 13 | 22 |
| Embodiment 5 | 902 | 14 | 23 |
| Embodiment 6 | 1084 | 19 | 34 |
| Embodiment 7 | 605 | 9 | 16 |
| Embodiment 8 | 567 | 7 | 14 |
| Embodiment 9 | 658 | 8 | 7 |
| Embodiment 10 | 457 | 4 | 12 |

It can be seen in table 2 that, compared with the comparative embodiments 1-5, the embodiments 1-10 of the present invention have a relatively high polishing rate for Silicon Nitride and a relatively low polishing rate for Silicon Oxide and Polysilicon, thereby they well meet the polishing requirement of the polishing wafer wherein Silicon Oxide/Polysilicon is used as the stop layer. The comparative embodiment 1 only comprises Silicon dioxide abrasive particles, and has a lower polishing rate for Silicon Nitride, while has a higher polishing rate for the Silicon Oxide and Polysilicon, that is, the polishing rate selectivity of the polishing slurry for the three substances is the opposite to the above polishing requirements: The comparative embodiments 2 with and 3 added are Hydroxyethylene-1,1-diphosphoric acid or ascorbic acid respectively on the basis of comparative embodiment 1, when they are used to polish, their polishing rates for the Silicon Nitride are improved compared with that of comparative embodiment. However, its polishing rates for Silicon Oxide and Polysilicon are very close to that for the Silicon Nitride, so it does not show a polishing rate selectivity for these three substances, and is not suitable for the semiconductor device manufacturing process in which Silica and Polysilicon layers are used as stop layers of the chemical mechanical polishing. In comparative embodiment 4, the organic acid of comparative embodiments 2 or 3 is replaced with 2-carboxyl pyridine, and the polishing rates for the Silicon Nitride and the Silicon Oxide are further improved, but they are still close to polishing rate for the Polysilicon, so comparative embodiment 4 does not show the polishing rate selectivity for these three substances, and is either not suitable for the semiconductor device manufacturing process in which Silicon Oxide and Polysilicon layers are used as stop layers of the chemical mechanical polishing. Compared with comparative embodiment 1, an ethoxylated butoxylated alkyl alcohol is added into comparative embodiment 5, the ethoxylated butoxylated alkyl alcohol shows an inhibitory effect on the polishing rate for Silicon Oxide and the Polysilicon, but these polishing rates are still over 200 Å/min, and the polishing rate for Silicon Nitride is still very low, that is, comparative embodiment 5 does not change the state of comparative embodiment 1 which has a low polishing rate for Silicon Nitride and a high polishing rates for Silicon Oxide and Polysilicon. Thus, the effect of improving the polishing rate selectivity between Silicon Nitride and Silicon Oxide or between Silicon Nitride and Polysilicon cannot be achieved by comparative embodiment 5, which is either not suitable for the semiconductor device manufacturing process in which Silicon Oxide and Polysilicon layers are used as stop layers of chemical mechanical polishing.

The embodiments 1-10 of the present invention uses a complex formulation of a nitrogen-containing heterocyclic compound comprising one or more carboxyl groups and an ethoxylated butoxylated alkyl alcohol to obtain a polishing rate of more than 500 Å/min for Silicon Nitride, and of less than 60 Å/min for Silicon Oxide and Polysilicon, that is, the polishing rate for the Silicon Nitride polishing is much higher than that for Silicon Oxide and Polysilicon, so that the polishing slurry can be well used to the chemical mechanical polishing in which Silicon Oxide and Polysilicon are used as stop layers. Because the embodiments of the invention have low polishing rates for Silicon Oxide and Polysilicon, the amount of removed oxide and polysilicon from the surface of the substrate in the polishing process can be well controlled.

In addition, the polishing slurry of the present invention can obtain a higher polishing rate for Silicon Nitride polishing or lower polishing rates for Silicon Oxide and Polysilicon, meanwhile maintaining the polishing rate for Silicon Nitride far higher than that for Silicon Oxide and Polysilicon, by selecting appropriate content of the particle abrasive, different kinds of nitrogen-containing heterocyclic compounds having carboxyl groups and different ethoxylated butoxide alkyl alcohols with varied alkyl chain lengths. For example, in the embodiment 6, the content of abrasive particles is high, and its polishing rate for Silicon Nitride exceeds 1000 Å/min; However, in the embodiment 10, the content of the various components are relatively low, and its polishing rates for Silicon Oxide and Polysilicon are only 4 Å/min and 12 Å/min. Therefore, the polishing slurry provided by the embodiments of the invention has a wide selection range of the polishing rate, and can be applied to chemical mechanical polishing under various conditions.

In conclusion, in the polishing slurry of the present invention, a nitrogen-containing heterocyclic compound having one or more carboxyl are used to improve the polishing rate for Silicon Nitride, and an ethoxylated butylated alkyl alcohol is used to inhibit the polishing rate for TEOS and polysilicon, so that its polishing rate for Silicon Nitride is much higher than that for Silicon Oxide and Polysilicon, and it can be well applied to chemical mechanical polishing in which the Silicon Oxide/Polysilicon is used as the stop layer, and can well control the amount of removed Oxide and Polysilicon from the substrate surface during polishing.

It should be noted that the content of the present invention is the mass percentage content, unless otherwise specified.

It should be noted that the embodiment of the present invention has better implementation, but are not any limitation of the present invention. Any technical personnel acquainted with this field may use the above revealed technical content to change or modify them to any equivalent embodiment. Without departing from the spirit and scope of the present invention, any modification and equivalent change or modification to the above embodiment according to the technical essence of the present invention still belongs to the scope of the technology solutions of the present invention.

The invention claimed is:

1. A chemical mechanical polishing slurry, comprising silicon dioxide particles, a nitrogen-containing heterocyclic compound having one or more carboxy group(s), and an ethoxylated butoxylated alkyl alcohol.

2. The chemical mechanical polishing slurry according to claim 1, wherein a mass percentage of the silicon dioxide particles is 0.5 wt % to 8 wt %.

3. The chemical mechanical polishing slurry according to claim 2, wherein the mass percentage of the silicon dioxide particles is 1 wt % to 5 wt %.

4. The chemical mechanical polishing slurry according to claim 1, wherein the nitrogen-containing heterocyclic compound is one or more compound(s) selected from the group consisting of a pyridine compound having one or more carboxy group(s), a piperidine compound having one or more carboxy group(s), a pyrrolidine compound having one or more carboxy group(s) and a pyrrole compound having one or more carboxy group(s).

5. The chemical mechanical polishing slurry according to claim 4, wherein the nitrogen-containing heterocyclic compound is one or more compound(s) selected from the group consisting of 2-carboxyl pyridine, 3-carboxyl pyridine, 4-carboxyl pyridine, 2,3-dicarboxyl pyridine, 2,4-dicarboxyl pyridine, 3,4-dicarboxyl pyridine, 2,6-dicarboxyl pyridine, 3,5-dicarboxyl pyridine, 2-carboxyl piperidine, 3-carboxyl piperidine, 4-carboxyl piperidine, 2,3-dicarboxyl piperidine, 2,4-dicarboxyl piperidine, 2,6-dicarboxyl piperidine, 3,5-dicarboxyl piperidine, 2-carboxyl pyrrolidine, 3-carboxyl pyrrolidine, 2,4-dicarboxyl pyrrolidine, 2,5-dicarboxyl pyrrolidine, 2-carboxyl pyrrole, 3-carboxyl pyrrole and 2,5-dicarboxypyrrole.

6. The chemical mechanical polishing slurry according to claim 1, wherein a mass percentage of the nitrogen-containing heterocyclic compound is 0.01 wt % to 0.5 wt %.

7. The chemical mechanical polishing slurry according to claim 1, wherein the number of ethoxy groups in the ethoxylated butoxylated alkyl alcohol is 5-20, the number of butoxy groups in the ethoxylated butoxylated alkyl alcohol is 5-20, and the alkyl group of the ethoxylated butoxylated alkyl alcohol is a straight or branched chain alkyl group with 11-15 carbon atoms.

8. The chemical mechanical polishing slurry according to claim 1, wherein a mass percentage of the ethoxylated butoxylated alky alkyl alcohol is 0.01 wt % to 0.1 wt %.

9. The chemical mechanical polishing slurry according to claim 1, wherein a pH of the chemical mechanical polishing slurry is 2-6.

10. A polishing method, comprising polishing silicon oxide, polysilicon, silicon nitride or a combination thereof with the chemical mechanical polishing slurry according to claim 1.

* * * * *